(12) United States Patent
Teggatz et al.

(10) Patent No.: US 8,102,718 B2
(45) Date of Patent: Jan. 24, 2012

(54) METHOD FOR PROGRAMMING A FLOATING GATE

(75) Inventors: Ross E. Teggatz, McKinney, TX (US); Wayne T. Chen, Plano, TX (US); Brett Smith, McKinney, TX (US); Eric Blackall, Richardson, TX (US)

(73) Assignee: Triune IP LLC, Richardson, TX (US)

(*) Notice: Subject to any disclaimer, the term of this patent is extended or adjusted under 35 U.S.C. 154(b) by 0 days.

(21) Appl. No.: 12/901,702

(22) Filed: Oct. 11, 2010

(65) Prior Publication Data
US 2011/0026324 A1 Feb. 3, 2011

Related U.S. Application Data

(62) Division of application No. 12/363,232, filed on Jan. 30, 2009, now Pat. No. 7,859,911.

(51) Int. Cl.
*G11C 11/34* (2006.01)
*G11C 16/04* (2006.01)
*G11C 16/06* (2006.01)

(52) U.S. Cl. ............ 365/185.28; 365/185.18; 365/185.2

(58) Field of Classification Search ............ 365/185.18, 365/185.2, 185.28
See application file for complete search history.

(56) References Cited

U.S. PATENT DOCUMENTS
6,297,689 B1 * 10/2001 Merrill .................. 327/540
* cited by examiner

*Primary Examiner* — Ly D Pham
(74) *Attorney, Agent, or Firm* — Michael T. Konczal; Konczal Law Firm PLLC

(57) ABSTRACT

The invention provides methods for programming a floating gate. A floating gate tunneling device is used with an analog comparing device in a circuit having a floating reference node and an offset-mitigating feedback loop for iteratively programming a floating gate, or multiple floating gates.

10 Claims, 6 Drawing Sheets

US 8,102,718 B2

METHOD FOR PROGRAMMING A FLOATING GATE

PRIORITY ENTITLEMENT

This application is a divisional application entitled to priority based on patent application Ser. No. 12/363,232 having a priority date of Jan. 30, 2009 now U.S. Pat. No. 7,859,911, which is incorporated herein for all purposes by this reference. The preceding application has been assigned to art unit 2827 and is classified in class 365-185280. This application and the parent application have at least one common inventor.

TECHNICAL FIELD

The invention relates to low-current analog integrated circuitry. More particularly, the invention relates to microelectronic floating gate circuit architectures, systems, and methods for their programming and operation.

BACKGROUND OF THE INVENTION

Programmable analog circuits are often required in applications where voltage accuracy and low power use are desirable traits.

Band gap reference voltage circuits are frequently used in applications that require a high degree of voltage accuracy. Band gap voltage reference circuits are known for their capabilities for providing excellent accuracy and stability over time and a range of operating temperatures. Unfortunately, however, band gap references are limited to a fixed voltage level, typically about 1.2V. The additional circuitry required for providing other voltage levels, such as fixed gain amplifiers for example, can be seriously detrimental to accuracy. Additionally, band gap voltage reference circuits generally draw a significant amount of power, presenting an additional problem in applications in which low power consumption is desirable.

Floating gate voltage reference circuits are often chosen for their low power requirements, but can be problematic in applications requiring a high degree of accuracy in providing a selected programmed voltage level, particularly over time and changes in temperature. A floating gate may be conceptualized as a charge oasis of conductive material electrically isolated from the outside world by a semiconductor substrate desert. The floating gate is capacitively coupled to the substrate or to other conductive layers. The floating gate is usually used to provide bias to the gate of a transistor and is readable without causing a significant leakage of charge. In theory, a floating gate programmed at a particular charge level remains at that level permanently, since the floating gate is insulated by the surrounding material. The floating gate is commonly charged using Fowler-Nordheim tunneling, or Channel Hot Carrier (CHC) tunneling, practices generally known to practitioners of the microelectronic arts. The accuracy of common floating gate circuits is limited for at least two primary reasons. Firstly, the potential on a floating gate decreases after it is programmed due to the capacitance inherent in the tunneling device. This voltage offset is well-defined and predictable, but is unavoidable in prior art floating gate voltage reference circuits because the capacitance of the tunneling device cannot be completely eliminated. Secondly, the accuracy of prior art floating gate voltage reference circuits is also hampered by the decay of the theoretically permanent charge on the floating gate over time. The decay of the charge over time occurs due to various factors, including the gradual escape of electrons from the tunneling device, and dielectric relaxation of the floating gate capacitors. The decay of charge is not entirely predictable since it can be influenced by environmental factors such as mechanical and thermal stress effects or other variables.

Due to these and other problems and potential problems, improved floating gate reference and feedback circuits would be useful and advantageous in the arts. Floating gate circuit architecture and associated methods adapted to rapid and accurate offset compensation would be particularly beneficial contributions to the art.

SUMMARY OF THE INVENTION

In carrying out the principles of the present invention, in accordance with preferred embodiments, the invention provides advances in the arts with novel methods directed to providing low-current floating gate architectures with offset mitigation capabilities and improved accuracy.

According to aspects of the invention, preferred embodiments of floating gate circuit methods use an iterative floating gate device and floating reference node programming technique for improved accuracy and stability.

According to one aspect of the invention, a preferred embodiment includes method steps for programming a floating gate circuit using a tunneling device and a floating reference node for iteratively programming an output with an offset-mitigating feedback loop.

According to another aspect of the invention, a preferred embodiment thereof includes the step of operating a suitably equipped circuit in a tunneling mode whereby charge is added to a tunneling device and conducted to a first op amp input such that the first op amp input voltage becomes equal with a second op amp input reference voltage. In a further step the op amp inputs are reversed for operating the op amp in a unity gain mode such that the output of the circuit is substantially equal to the reference voltage.

According to another aspect of the invention, a preferred embodiment thereof includes using the steps for programming a plurality of floating gates.

According to yet another aspect of the invention, a preferred embodiment includes the steps of monitoring the output of the circuit, and based on a comparison of the circuit output with a preselected tolerance threshold, selectably reiterating the tunneling mode step and the unity gain mode step using an incrementally changed reference voltage.

According to another aspect of the invention, a preferred embodiment includes a step of, using a voltage level shifting device operably coupled to an op amp output, providing a voltage (and/or current) to a tunneling device in order to induce tunneling in the tunneling device. A floating reference voltage is conducted through the tunneling device, in turn causing voltage at a first op amp input to rise. Further, a reference voltage is provided to a second input of the op amp until the first and second op amp input voltages equalize, whereafter, voltage at the tunneling device is decreased to a level insufficient to maintain tunneling through the tunneling device. In a further step, the op amp inputs are caused to reverse polarity, thereby placing the op amp in unity gain mode whereby the op amp output, and thus the output of the floating gate circuit, is programmed at the reference voltage value.

The invention has advantages including but not limited to providing one or more of the following features; improved accuracy, rapid programming, improved stability over a range of operating conditions, and efficient, ultra-low power requirements. These and other advantageous features and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to like references in the various drawings unless otherwise noted. Descriptive and directional terms used in the written description such as front, back, top, bottom, upper, side, et cetera, refer to the drawings themselves as laid out on the paper and not to physical limitations of the invention unless specifically noted. The drawings are not to scale, and some features of embodiments shown and discussed are simplified or amplified for illustrating principles and features, as well as anticipated and unanticipated advantages of the invention.

DESCRIPTION OF PREFERRED EMBODIMENTS

While the making and using of various exemplary embodiments of the invention are discussed herein, it should be appreciated that the present invention provides inventive concepts which can be embodied in a wide variety of specific contexts. It should be understood that the invention may be practiced with various electronic circuits, microelectronic circuit components, systems, system components, and subsystems without altering the principles of the invention. For purposes of clarity, detailed descriptions of functions, components, and systems familiar to those skilled in the applicable arts are not included. In general, the invention provides programmable analog voltage reference circuits for rapidly and accurately setting an output to a given selected voltage.

Figure 1:
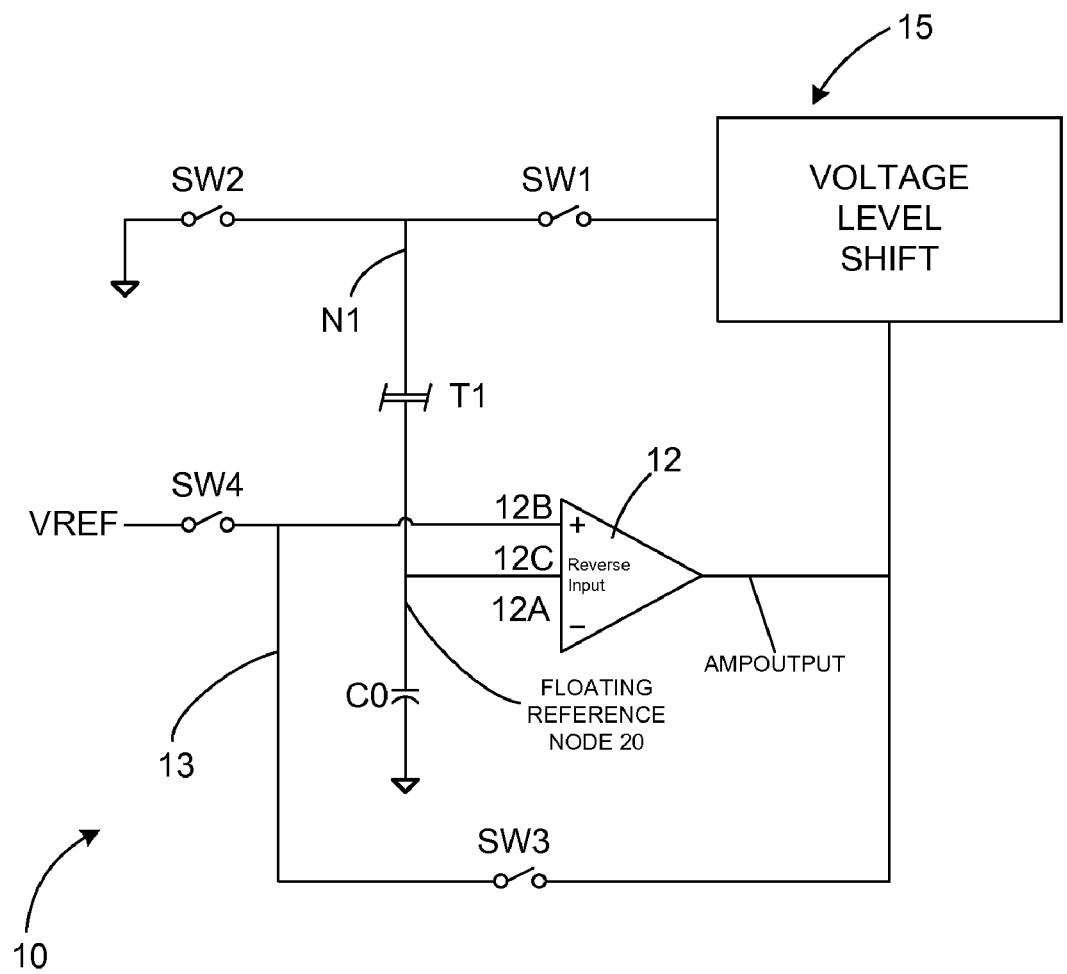
FIG. 1 is a simplified schematic diagram depicting an example of a circuit useful for implementing the methods of the invention.

Now referring primarily to FIG. 1, the structure of an example of an embodiment of a programmable floating gate circuit 10 is shown in a simplified schematic, and its operation is described. An op amp 12 and a voltage level shifting device 14 are interconnected in a configuration in which a first switch SW1 controls the output of the voltage level shifting device 14 to a tunneling device T1. A second switch SW2 selectably connects the tunneling device T1 to ground. A third switch SW3 selectably completes a feedback loop 13 from the op amp output AMPOUTPUT to a second op amp input 12B. A fourth switch SW4 selectably connects a reference voltage VREF to the second op amp input 12B as well. Note that the op amp output AMPOUTPUT is also preferably coupled to the input 15 of the voltage level shifting device 14. The first op amp input 12A is connected at a junction referred to herein as a floating reference node 20, denoting the connection among the op amp 12, the tunneling device T1, and ground. The capacitance of the configuration is represented by C0 between the reference node 20 and ground. A reverse input 12C to the op amp 12 is provided for selectably reversing the polarity of the op amp, 12.

The circuit arrangement shown in FIG. 1, and its functional equivalents, facilitates operation in two modes, tunneling mode, and unity gain mode, in the following manner. Assume for the sake of illustration that the potential of the floating reference node 20 is initially at zero volts. Further assume for the sake of illustration that the switches shown in FIG. 1 are in the following initial states: SW1 closed; SW2 open; SW3 open; SW4 closed. It can be seen that a path is provided from the voltage level shifting device 14, through SW1, to a floating gate at tunneling device T1. Accordingly, during programming the voltage at the tunneling device T1 is raised to a level sufficient for Fowler-Nordheim tunneling to occur. As a result, voltage increases at the floating reference node 20, initially causing the voltage at the first op amp input 12A to rise. The closed state of SW4 also applies reference voltage VREF to the second input 12B of the op amp 12. Gradually, the voltage at the floating reference node 20 becomes equal to VREF, the equal voltage at the op amp inputs 12A and 12B causes the op amp output AMPOUTPUT to decrease, in turn diminishing the input 15 to the voltage level shifting device 14, which causes a corresponding drop in the voltage at the tunneling device T1, halting the Fowler-Nordheim tunneling. The first and fourth switches SW1, SW4, then open, and switches two and three, SW2, SW3, close, placing feedback 13 on the second op amp input 12B, while the selectable application of voltage at the reverse op amp input 12C is preferably used to reverse the first 12A and second 12B inputs in order to cause the op amp 12 to operate as a unity gain voltage buffer. Thus, it can be seen that the circuit 10 has two operating states. A tunneling mode is used for adding charge to the tunneling device in order to bring the floating gate to a voltage level equal to, or nearly equal to, the floating reference voltage. A buffer mode is used to operate the op amp as a unity gain buffer maintaining the selected voltage level.

The AMPOUTPUT voltage is preferably monitored using suitable techniques known in the arts, and in the event a selected voltage level is not present within in acceptable tolerances, e.g., the AMPOUTPUT voltage is too low due to non-ideal behavior of the circuit, the process described above may be reiterated with the modification that the reference voltage VREF may be increased, which in turn results in an increased voltage at the floating reference node 20, and ultimately increased voltage at AMPOUTPUT. Using the circuits and techniques of the invention, the AMPOUTPUT voltage can be rapidly adjusted to approach a selected value within precise tolerances by using successive iterations of the steps shown and described. The programmed floating gate may be erased to reset the circuit by raising the voltage at C0, energizing the trapped electrons in the floating gate to an energy level sufficient to enable them to escape.

Figure 2:
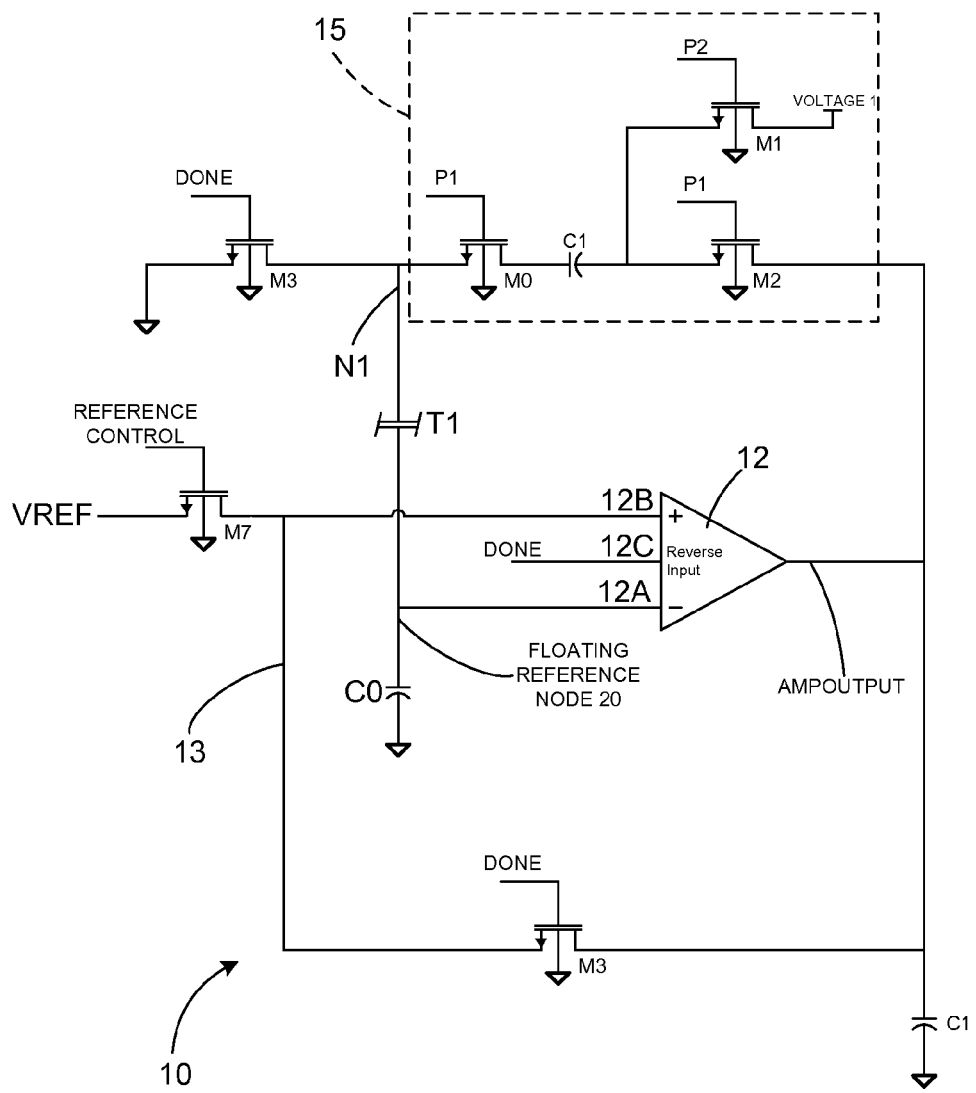
FIG. 2 is schematic diagram of a preferred alternative embodiment of a circuit useful for implementing the invention.
Figure 2:
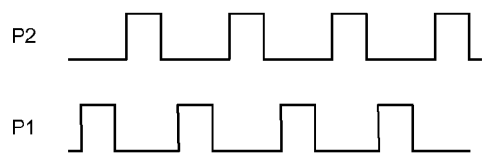

Various implementations of the invention are possible, and all variations of potential embodiments cannot, and need not, be shown herein. Although specific exemplary embodiments using representative component parts are shown for the purposes of illustration, some elements of the circuit may be substituted without undue experimentation by those skilled in the arts. For instance, analog comparison devices such as analog to digital converter (ADC) devices or comparators may be used in place of op amps, level shifter topology may be implemented in various ways, and suitable modifications may be made to adapt the circuit for current, power, transconductance, or other inputs and/or outputs. The invention may be used, for example, in power systems, energy systems, portable electronics, battery and power supply management systems, and the like. An example of a preferred embodiment is shown in FIG. 2, providing a more detailed view of an implementation of the conceptual circuit 10 introduced in FIG. 1. A control signal P1 is generated by a suitable voltage source (not shown) for controlling transistors M0 and M2. Control signal P2 is generated by a voltage source VOLTAGE1 for controlling transistor M1. A voltage level shifting circuit 14 is implemented by the charge pump configuration formed by transistors M0, M1 and M2. The voltage level shifting circuit 14 produces sufficient voltage to induce Fowler-Nordheim tunneling at tunneling device T1, placing a charge on the floating gate of the tunneling device T1. The tunneling device T1 is connected to the first input 12A of the op amp 12. The second op amp input 12B is connected directly to a reference voltage source VREF through transistor M7, controlled by a reference voltage control. A "DONE" signal may be asserted following the completion of a programming iteration using a suitable voltage source. Upon triggering by the DONE signal, the transistor M3 selectably couples the tunneling device T1 to ground, a signal at reverse input 12C reverses op amp 12 polarity, and the feedback transistor M3 places the op amp 12 in negative feedback mode, operating as a unity gain voltage buffer. The accompanying timing diagram at the bottom of FIG. 2 illustrates the operation of the example of the embodiment of the circuit 10. As shown, when P1 is on, and tunneling at the tunneling device T1 is caused to occur, P2 is off, and vice versa, when p1 is switched off, P2 is switched on with the result that the DONE signal is activated, causing the op amp 12 to operate in unity gain mode.

The steps described may be reiterated one or more times as needed in order to approach the desired voltage level within a selected degree of accuracy, although it is believed that in general few iterations are required for most applications. It should be understood by those skilled in the arts that the circuit and components shown are representative of one example of an embodiment of the circuitry and methods of the invention for illustrative purposes and are not exclusive, restrictive, or limiting, as to the potential implementations and uses of the invention. For example, those skilled in the arts will appreciate that the floating gate circuit architecture and offset cancellation methods may be used in a wide variety of contexts for managing offsets of electronic signals such as voltage, current, impedance, and the like.

Figure 3:
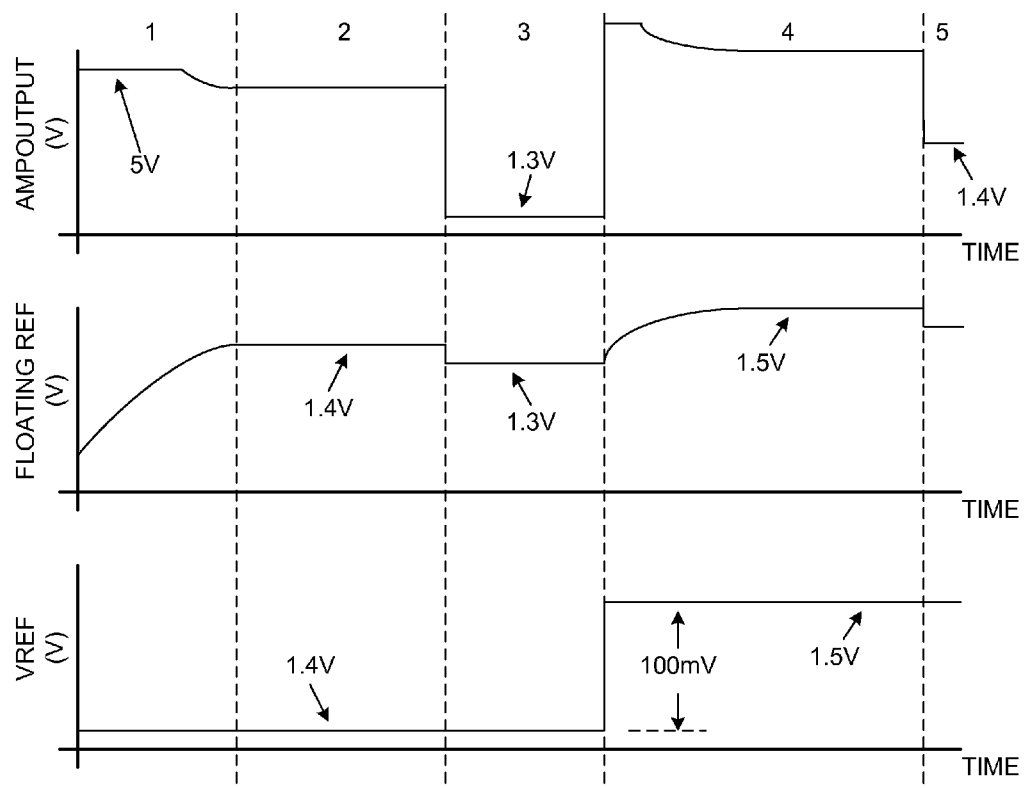
FIG. 3 depicts wave form examples illustrating the operation of the embodiments of the invention introduced with reference to FIGS. 1 and 2.

FIG. 3 illustrates an example of the use of preferred embodiments of the apparatus and method of the invention as shown in and described with respect to FIG. 1 and FIG. 2. Voltage waveforms are shown for voltages measured at AMPOUTPUT, FLOATINGREF (from floating node 20), and VREF, plotted during the course of operation of the circuit 10. The time span shown is divided into five segments for reference purposes. Referring to segment numeral 1, it can be seen that VREF is initially 1.4V, a representative preselected value arbitrarily chosen for illustration purposes. It should be appreciated by those skilled in the arts that voltage levels shown and described are not restrictive, but are illustrative of typical voltages levels with which the invention may be used within the context of the microelectronics arts. The FLOATINGREF voltage can be seen to increase during segment 1 from an initial value near zero Volts to 1.4V at segment 2. The output voltage AMPOUTPUT drops (segment 1) from an initial value of about 5V, to about 4V when the floating reference voltage FLOATINGREF reaches a level equal to the reference voltage VREF, shown at reference numeral 2. As shown where segment 2 meets segment 3, when tunneling is stopped, the output AMPOUTPUT operates in unity gain mode, but due to non-ideal operation of the circuitry, e.g., capacitive coupling C0 at the tunneling device T1 (FIGS. 1 and 2), and possibly also due to switching inefficiencies, outputs 1.3V instead of the selected target voltage of 1.4V. Referring again to the trace for VREF, at segment 4, the reference voltage is increased by 100 mV to compensate for the non-idealities of the circuit, and the steps are reiterated, in turn increasing FLOATINGREF to 1.5V, resulting in the output AMPOUTPUT shown at segment 5, of 1.4V, and the circuit 10 is permitted to remain in unity gain mode. It should be understood that the values shown in this example are provided as an illustration of the operation of a preferred embodiment of the invention and are not exclusive or limiting. The invention may be practiced using a wide range of values as appropriate in a broad range of applications and contexts.

Figure 4:
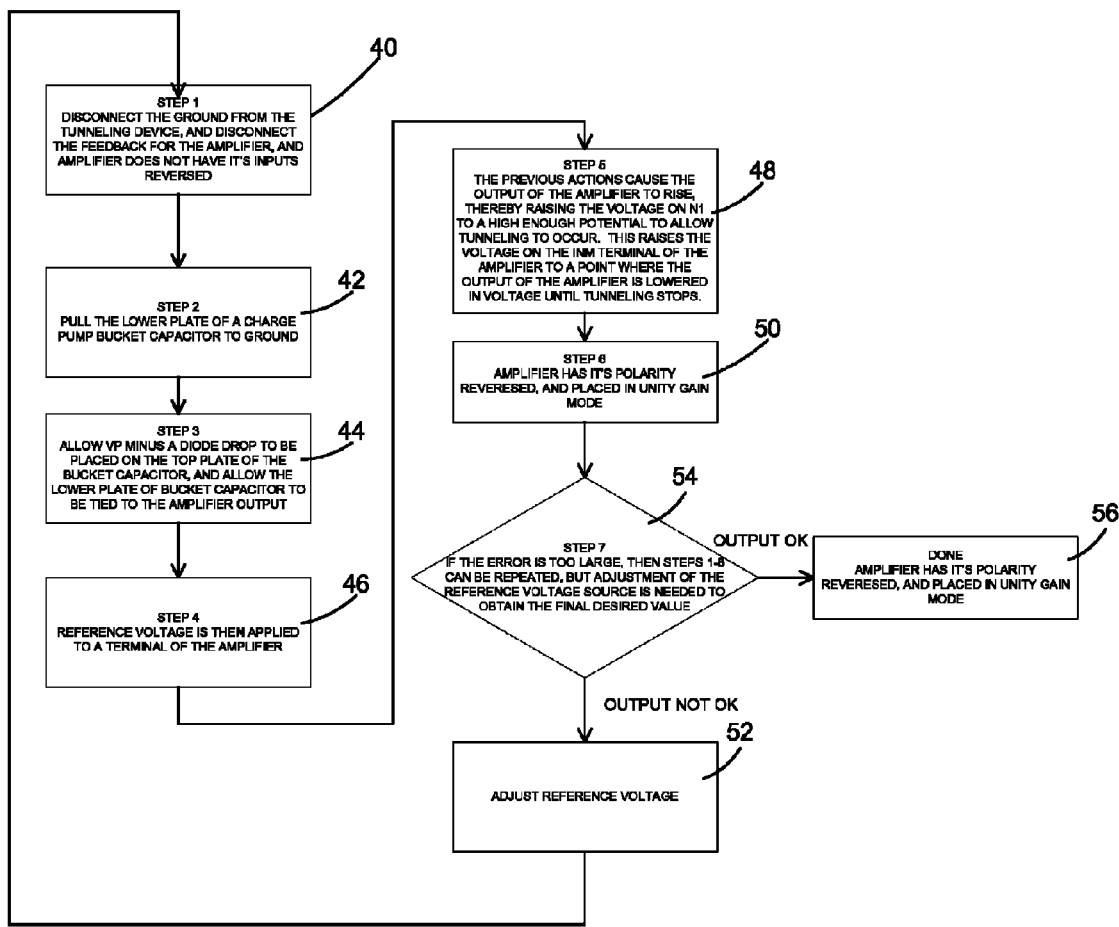
FIG. 4 is a process flow diagram showing an alternative view of an example of steps in preferred methods of the invention.

An alternative depiction of steps in methods of programming circuits using floating gate devices according to the invention is shown in FIG. 4. Shown in box 40, in an initial state, the tunneling device is disconnected from ground, and the amplifier feedback is disconnected 42. Applying voltage from the amplifier output and voltage shifting device to the tunneling device 44, and a reference voltage to the amplifier reference input 46, tunneling is induced 48. Tunneling permits the voltage at the floating reference input terminal of the op amp to increase to the point where the output voltage of the op amp decreases until tunneling stops 48. The polarity of the op amp is then reversed, placing the op amp in unity gain mode 50. As shown at decision diamond 54, a determination is made of whether the output level is within acceptable tolerances. If the op amp output voltage is acceptable, the tunneling device is left tied to ground and the op amp remains in unity gain mode 56. If an acceptable voltage level has not been reached, the process is reiterated, returning to step 40 after an adjustment is made to the reference voltage 52.

Figure 5:
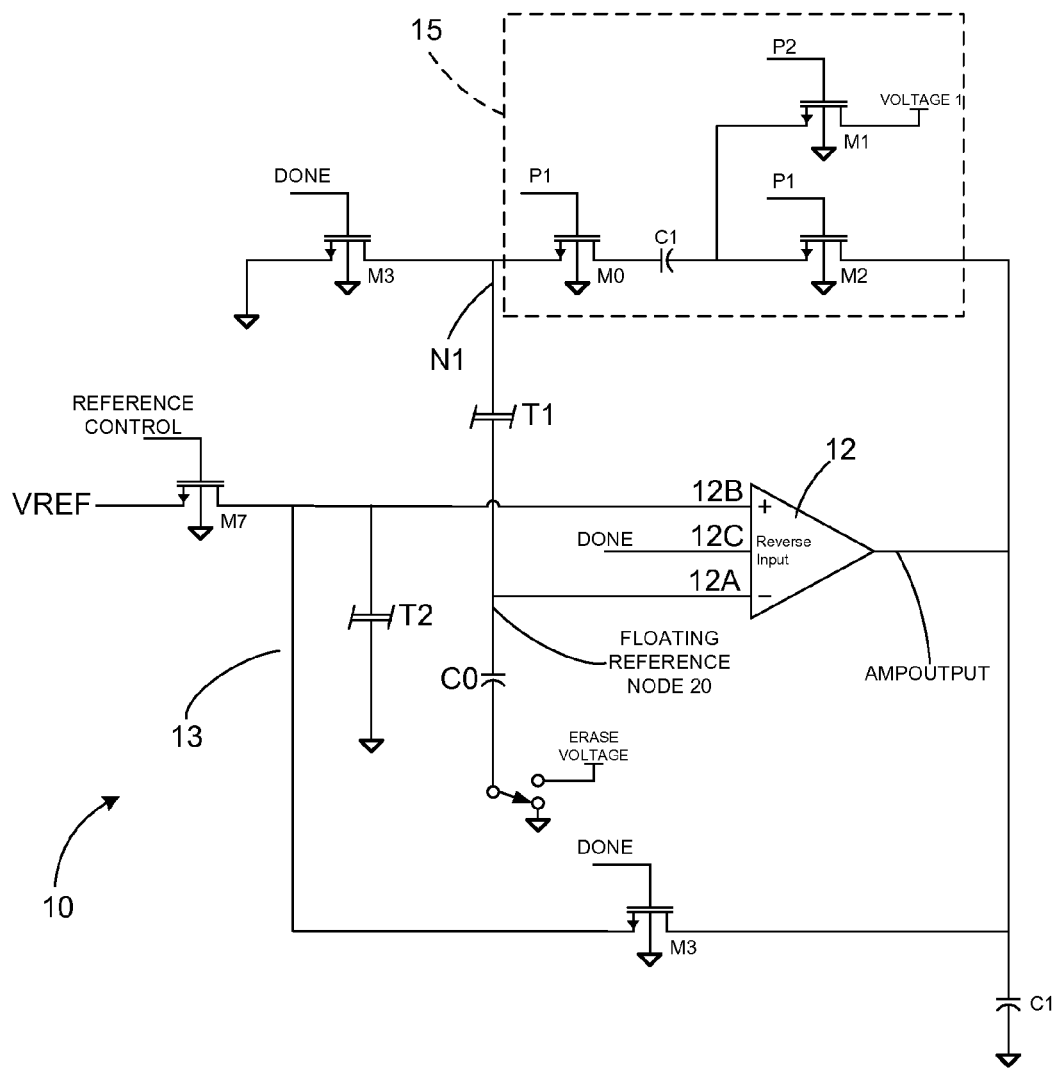
FIG. 5 is schematic diagram of a preferred alternative embodiment of a multiple floating gate programming circuit useful for implementing the invention.
Figure 5:
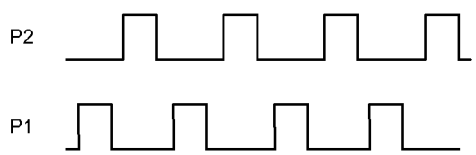

FIG. 5 is schematic diagram of an alternative embodiment of a multiple floating gate programming circuit. It can be seen that the exemplary circuit 10 of FIG. 5 resembles that of FIG. 2 in that in a similar arrangement, a level shifter 15 is used to place charge on the floating gate of tunneling device T1. Tunneling device T1 is coupled to the first input 12A of the op amp 12. In this example, a second tunneling device T2 is also shown connected between the reference voltage VREF, the second op amp input 12B, and ground. As the first voltage at the first input 12A rises due to the tunneling occurring at the first tunneling device T1, the voltage reference VREF applied at the second input 12B is also applied to the gate of the second tunneling device T2. As the voltages at the floating reference node 20 and the reference VREF equalize, the tunneling ceases. The application of a signal "DONE" at the reverse op amp input 12C is used to reverse the op amp polarity, placing it in a unity gain mode of operation.

Figure 6:
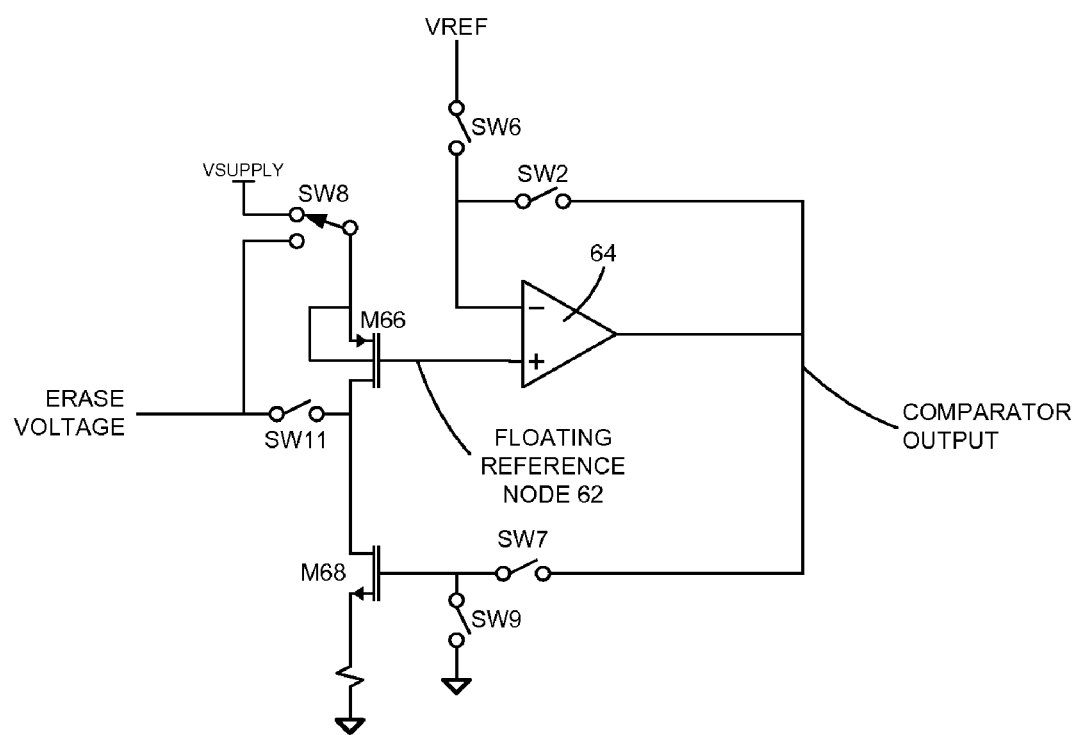
FIG. 6 is schematic diagram of an example of an alternative embodiment of a floating gate programming circuit useful for implementing the invention.

An alternative approach to programming a floating gate for practicing the invention is shown in FIG. 6. In this schematic diagram of an example of an alternative embodiment of a floating gate programming circuit, Channel-Hot-Carrier (CHC) programming is used to program the floating gate 62 at transistor device M66. Initially, with switches SW6 and SW7 closed and SW8 tied to VSUPPLY, the amplifier/comparator 64 is functioning in comparator mode. The floating reference node 62 is at a high voltage and the amp 64 comparator output is high, causing device M68 to turn on. The conduction through device M66 causes channel-hot-carrier transfer of charge to occur, placing a charge on the floating gate at node 62. When the voltage at node 62 goes lower than the reference voltage VREF, the comparator 64 output goes low, causing device M68 to turn off, in turn causing the CHC transfer of charge to node 62 to cease. At this point, switch SW9 is closed, ensuring that M68 remains off preventing further CHC at M66. Closing switch SW10 causes the amplifier/comparator 64 to operate in unity gain amplifier mode. The value at the floating node 62 is preferably monitored, whereby the reference voltage VREF may be incremented and the steps reiterated in order to compensate for any errors introduced by non-deal circuitry, such as for example errors introduced by capacitive coupling due to switching. In order to erase the charge stored on the floating gate 62, switches SW6, SW9, and SW11 are closed, and SW8 is tied to the drain of device M66. The floating node 62 begins from low voltage, causing the output of the comparator to be low. The ERASE VOLTAGE coupled to M66 through switches SW8 and SW11 is high, causing Fowler Nordheim tunneling to occur at the floating gate device M66. As the voltage at the floating node 62 rises above the reference voltage VREF, the comparator output is high. At this point SW11 is preferably opened, causing tunneling in the floating gate device M66 to come to a stop.

The methods and apparatus of the invention provide one or more advantages including but not limited to, speed, accuracy, offset compensation, and efficiency in programmable analog circuits. While the invention has been described with reference to certain illustrative embodiments, those described herein are not intended to be construed in a limiting sense. For example, variations or combinations of steps or materials in the embodiments shown and described may be used in particular cases without departure from the invention. Various modifications and combinations of the illustrative embodiments as well as other advantages and embodiments of the invention will be apparent to persons skilled in the arts upon reference to the drawings, description, and claims.

We claim:

1. A method for programming a floating gate circuit comprising the steps of:
    using a level shifting device operably coupled to an analog comparing device output, providing a voltage to a tunneling device, the voltage of sufficient magnitude to induce tunneling in the tunneling device, whereby a floating reference signal is conducted through the tunneling device, the floating reference signal in turn causing a fist input signal at a first analog comparing device input to rise;
    providing a second input signal to a second input of the analog comparing device until the first and second input signals become equal, whereby the analog comparing device output to the input of the level shifting device decreases, whereby the voltage at the tunneling device is changed to a level insufficient to maintain tunneling in the tunneling device;
    placing feedback on the second analog comparing device input; and
    causing the analog comparing device to reverse polarity, thereby placing the analog comparing device in unity gain mode, whereby the analog comparing device output, and thus the output of the floating gate circuit, is programmed at the reference signal value.

2. The method of claim 1 adapted to provide a current output signal.

3. The method of claim 1 adapted to provide a voltage output signal.

4. The method of claim 1 wherein the step of adding charge to a floating gate of the tunneling device further comprises using Fowler-Nordheim tunneling.

5. The method of claim 1 wherein the step of adding charge to a floating gate of the tunneling device further comprises using Channel-Hot-Carrier tunneling.

6. The method of claim 1 further comprising the step of independently programming one or more additional floating gates operably coupled to the analog comparing device.

7. The method of claim 1 further comprising the step of simultaneously programming one or more additional floating gates operably coupled to the analog comparing device.

8. The method according to claim 1 comprising the further steps of monitoring the output signal in order to determine whether it is a tolerably accurate representation of a selected reference signal level; and,
    in the event the selected signal level is not present, reiterating the steps using an incrementally changed reference signal.

9. The method of claim 1 further comprising the step of erasing the floating gate by raising the voltage at the tunneling device to a level at which charge escapes from the floating gate.

10. The method of claim 1 further comprising the step of associating the output with an electronic system.

* * * * *